United States Patent
Nishino et al.

(10) Patent No.: US 9,934,905 B2
(45) Date of Patent: Apr. 3, 2018

(54) METHOD OF MANUFACTURING MULTILAYER BOARD, MULTILAYER BOARD, AND ELECTROMAGNET

(71) Applicant: Murata Manufacturing Co., Ltd., Nagaokakyo-shi, Kyoto-fu (JP)

(72) Inventors: Kosuke Nishino, Nagaokakyo (JP); Kuniaki Yosui, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 14/873,282

(22) Filed: Oct. 2, 2015

(65) Prior Publication Data
US 2016/0027578 A1    Jan. 28, 2016

Related U.S. Application Data

(63) Continuation of application No. PCT/JP2014/080304, filed on Nov. 17, 2014.

(30) Foreign Application Priority Data

Nov. 28, 2013  (JP) ................................ 2013-246487

(51) Int. Cl.
*H01F 41/04*  (2006.01)
*H05K 1/16*  (2006.01)
(Continued)

(52) U.S. Cl.
CPC ............ *H01F 41/041* (2013.01); *H01F 7/06* (2013.01); *H01F 17/0013* (2013.01);
(Continued)

(58) Field of Classification Search
CPC ...... H01F 2027/2809; H01F 2007/068; H05K 3/4632
See application file for complete search history.

(56) References Cited

U.S. PATENT DOCUMENTS 5,374,469 A * 12/1994 Hino .................... H05K 3/4632
428/209
6,000,128 A    12/1999 Umeno et al.
(Continued)

FOREIGN PATENT DOCUMENTS

JP    04-368105 A    12/1992
JP    08-69935 A    3/1996
(Continued)

OTHER PUBLICATIONS

Official Communication issued in International Patent Application No. PCT/JP2014/080304, dated Dec. 16, 2014.

*Primary Examiner* — Elvin G Enad
*Assistant Examiner* — Malcolm Barnes
(74) *Attorney, Agent, or Firm* — Keating & Bennett, LLP

(57) ABSTRACT

In a linear conductor forming step, a wide portion having a relatively large line width and a narrow portion having a relatively small line width are formed in each of a plurality of linear conductors. In addition, in a multilayer board, in base material layers adjacent to each other in a stacking direction, the wide portion overlaps the narrow portion on the adjacent base material layer, and end portions of the wide portions at both sides of the narrow portion in a line width direction, in a planar view. The wide portions are disposed such that the end portions thereof overlap each other in the stacking direction and resistance of a fluid thermoplastic resin increases. The narrow portion is located between the wide portions in the stacking direction.

10 Claims, 6 Drawing Sheets

(51) Int. Cl.
*H05K 3/46* (2006.01)
*H01F 7/06* (2006.01)
*H01F 41/02* (2006.01)
*H01F 17/00* (2006.01)

(52) U.S. Cl.
CPC ....... *H01F 41/0233* (2013.01); *H01F 41/042* (2013.01); *H05K 1/165* (2013.01); *H05K 3/4617* (2013.01); *H05K 3/4632* (2013.01); *H01F 2007/068* (2013.01); *H01F 2017/0073* (2013.01); *H05K 2201/0129* (2013.01)

(56) References Cited

U.S. PATENT DOCUMENTS

| | | | |
|---|---|---|---|
| 2003/0098496 A1* | 5/2003 | Sugiyama | H01F 17/0006 257/531 |
| 2006/0202318 A1* | 9/2006 | Satou | H01L 27/14618 257/686 |
| 2008/0197963 A1* | 8/2008 | Muto | H01F 17/0013 336/200 |
| 2008/0303622 A1* | 12/2008 | Park | H01F 17/0013 336/200 |
| 2009/0091903 A1* | 4/2009 | Hsu | H05K 1/185 361/761 |
| 2011/0193661 A1* | 8/2011 | Baks | H01H 50/005 335/136 |
| 2012/0075038 A1 | 3/2012 | Kaizaki | |

FOREIGN PATENT DOCUMENTS

| | | | | |
|---|---|---|---|---|
| JP | H1197243 A | * | 4/1999 | ............. H01F 17/00 |
| WO | 2010/137083 A1 | | 12/2010 | |

* cited by examiner

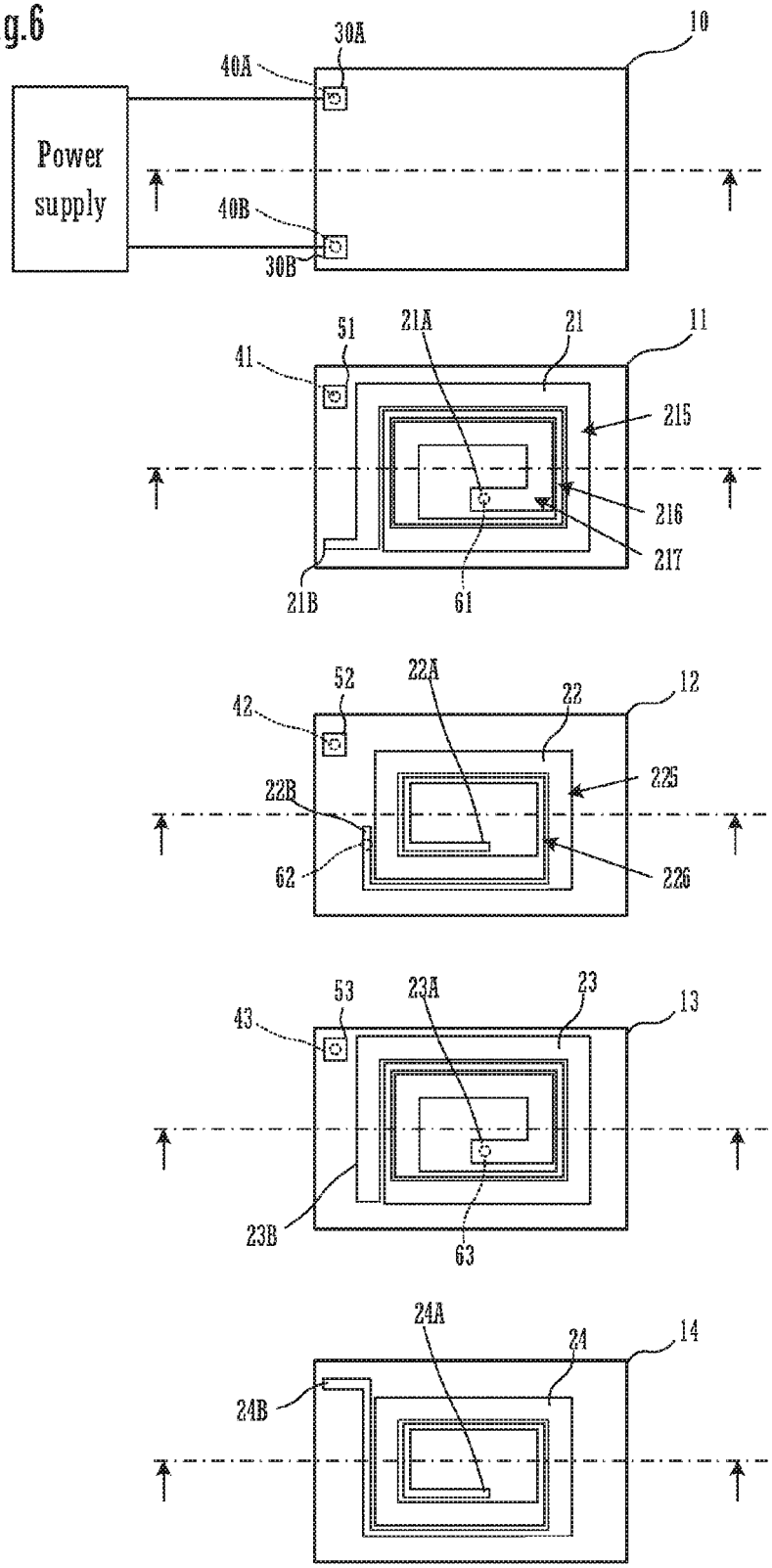

METHOD OF MANUFACTURING MULTILAYER BOARD, MULTILAYER BOARD, AND ELECTROMAGNET

BACKGROUND OF THE INVENTION

1. Field of the Invention

The present invention relates to a method of manufacturing a multilayer board including a plurality of stacked base material layers made of a thermoplastic resin, a multilayer board, and an electromagnet.

2. Description of the Related Art

A coil which is provided by patterning a conductor on an insulator is known. For example, Japanese Unexamined Patent Application Publication No. 4-368105 describes a spiral coil which is provided by patterning a linear conductor in a spiral manner on both surfaces of a polyimide film and performing interlayer connection therebetween.

However, when a plurality of base material layers made of a thermoplastic resin are stacked and thermocompression bonding is performed, the thermoplastic resin flows during the thermocompression bonding, and thus linear conductors may be tilted in a stacking direction. If the linear conductors tilt as described above, there is a possibility that the linear conductors adjacent to each other in the stacking direction come into contact with each other, causing a short circuit.

In order to preventing tilting of the linear conductors in the stacking direction, for example, it is considered to increase the line width of each linear conductor. However, in order to increase the line width of each linear conductor, it is necessary to increase the center interval (pitch) between the linear conductors adjacent to each other in a planar direction, and when the line width is increased, the wiring density decreases.

SUMMARY OF THE INVENTION

Accordingly, preferred embodiments of the present invention provide a method of manufacturing a multilayer board which significantly reduces or prevents tilting of linear conductors in a stacking direction during thermocompression bonding, without decreasing a wiring density, to prevent linear conductors adjacent to each other in the stacking direction from coming into contact with each other, and also provide a multilayer board, and an electromagnet.

A method of manufacturing a multilayer board according to a preferred embodiment of the present invention includes the steps of forming a plurality of linear conductors on a base material layer made of a thermoplastic resin; and stacking a plurality of the base material layers and heating and pressing the base material layers.

In a method of manufacturing the multilayer board according to a preferred embodiment of the present invention, in the step of forming the linear conductors, a wide portion having a relatively large line width and a narrow portion having a relatively small line width are formed in the linear conductors on the same base material layer; and in the base material layers adjacent to each other in a stacking direction, the wide portion overlaps the narrow portion on the adjacent base material layer and end portions of the wide portions formed at both sides of the narrow portion in a line width direction, in a planar view.

As described above, in a method of manufacturing the multilayer board according to a preferred embodiment of the present invention, the wide portion having a relatively large line width and the narrow portion having a relatively small line width are formed in the linear conductors on the same base material layer. The narrow portion overlaps the wide portion at the lower side (or the upper side) thereof in a planar view. In addition, the end portions of the wide portions formed at both sides of the narrow portion overlap the end portions of the wide portion at the lower side (or the upper side) thereof. That is, the end portions of the wide portions overlap each other, and the narrow portion is disposed between the wide portions.

Since the end portions of the wide portions having a large line width overlap each other, the resistance of the fluid thermoplastic resin increases, and thus tilting of the wide portions in the stacking direction is significantly reduced or prevented. Since the narrow portion is located between the wide portions so that tilting of the wide portions in the stacking direction is significantly reduced or prevented, tilting of the narrow portion in the stacking direction is also significantly reduced or prevented. In the multilayer board, since the narrow portion is present, it is unnecessary to increase the center interval (pitch) between the linear conductors adjacent to each other in a planar direction. Therefore, it is possible to significantly reduce or prevent tilting of the linear conductors in the stacking direction during thermocompression bonding without decreasing a wiring density, thus preventing the linear conductors adjacent to each other in the stacking direction from coming into contact with each other.

Even when the number of the base material layers is two, for example, the multilayer board has the effect of significantly reducing or preventing tilting in the stacking direction. However, when the number of the base material layers is three or more, for example, the narrow-width portion is located between the wide-width portions in the up-down direction, so that it is possible to further reduce or prevent tilting in the stacking direction.

In addition, it is preferable to further reduce or prevent tilting in the stacking direction by providing a preferred embodiment in which in the base material layers adjacent to each other in the stacking direction, the wide portion on one of the base material layers overlaps the narrow portion on the other of the base material layers, and end portions of the wide portions formed at both sides of the narrow portion in the line width direction, in a planar view, and at least one of the wide portions formed at both sides of the narrow portion on the other of the base material layers in the line width direction overlaps the narrow portion adjacent to the wide portion on the one of the base material layers in the line width direction, in a planar view. That is, when the wide portions are disposed in a staggered manner, the resistance of the fluid thermoplastic resin is increased, so that it also more reliably reduces or prevents tilting in the stacking direction.

A method of manufacturing a multilayer board according to a preferred embodiment of the present invention is suitable in the case where the linear conductors are connected to each other to define a coil. In this configuration, since it is possible to prevent a decrease in the wiring density of the linear conductors defining the coil, it is possible to significantly reduce or prevent tilting of the linear conductors during thermocompression bonding without decreasing the inductance value of the coil.

In addition, the straight portion extending along a principal surface of the base material layer of the coil is more likely to tilt particularly in the stacking direction than a non-straight portion (e.g., a corner portion), and thus the wide portion and the narrow portion are preferably formed in the relatively long straight portion of the coil.

In addition, a multilayer board according to a preferred embodiment of the present invention includes a plurality of stacked base material layers each made of a thermoplastic resin and including a plurality of linear conductors provided thereon. On the same base material layer, the linear conductors include a wide portion having a relatively large line width and a narrow portion having a relatively small line width, and on the base material layers adjacent to each other in a stacking direction, the wide portion overlaps the narrow portion on the adjacent base material layer, and end portions of the wide portions at both sides of the narrow portion in a line width direction, in a planar view.

In the multilayer board, the wide portion having a large line width and the narrow portion having a small line width are present in the linear conductors and the wide portions having a large line width are disposed such that the end portions thereof overlap each other as described above, the resistance of the thermoplastic resin increases, so that tilting in the stacking direction is significantly reduced or prevented. Since the narrow portion is located between the wide portions, tilting of the wide portions in the stacking direction is significantly reduced or prevented, so that tilting of the narrow portion in the stacking direction is also significantly reduced or prevented. In the multilayer board, since the narrow portion is present, it is unnecessary to increase the center interval (pitch) between the linear conductors adjacent to each other in the planar direction. Therefore, it is possible to significantly reduce or prevent tilting of the linear conductors in the stacking direction during thermocompression bonding without decreasing the wiring density, thus preventing the linear conductors adjacent to each other in the stacking direction from coming into contact with each other.

In addition, in the multilayer board, the plurality of linear conductors are preferably connected to each other to define a coil. Moreover, it is possible to use the multilayer board as an electromagnet further including a power supply portion configured to apply current to the coil, for example.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 6 are exploded planar views of respective base material layers of the multilayer board in FIG. 1 and a power supply portion.

DETAILED DESCRIPTION OF THE PREFERRED EMBODIMENTS

Figure 1:
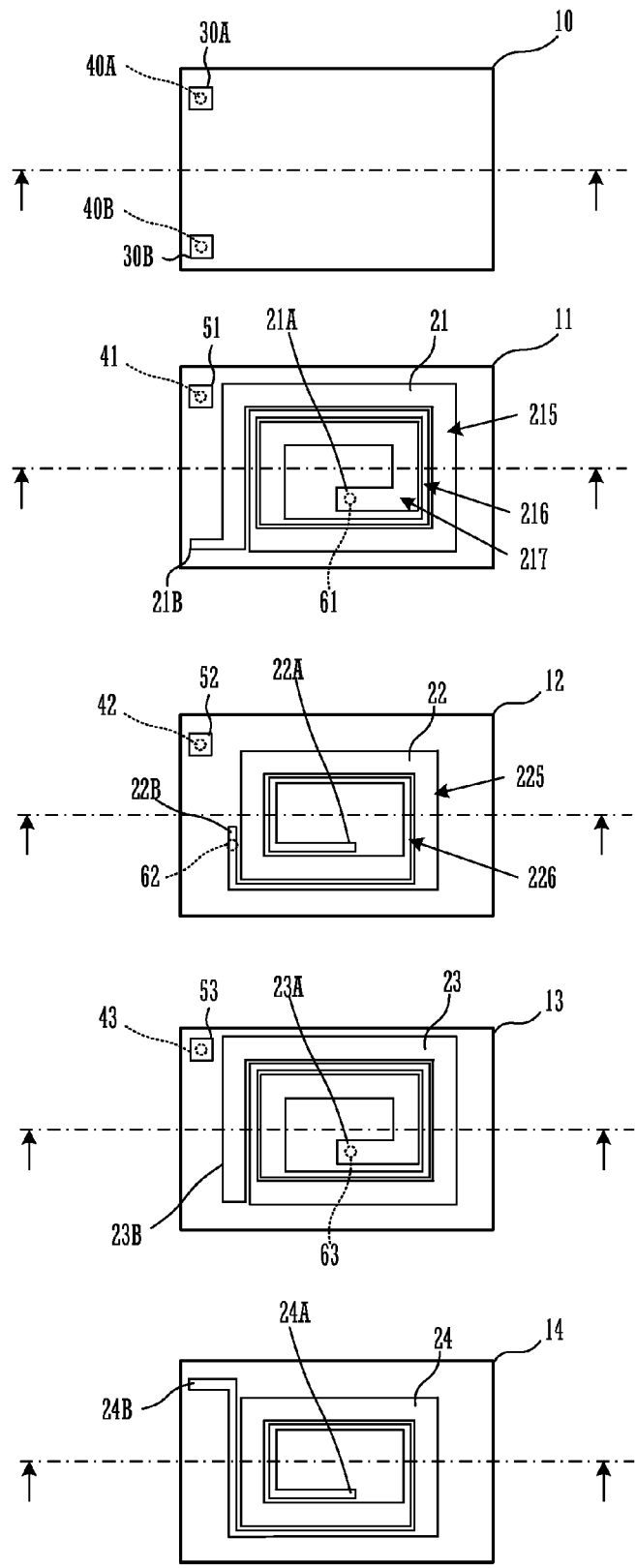
FIG. 1 provides exploded planar views of respective base material layers of a multilayer board.
Figure 2A:
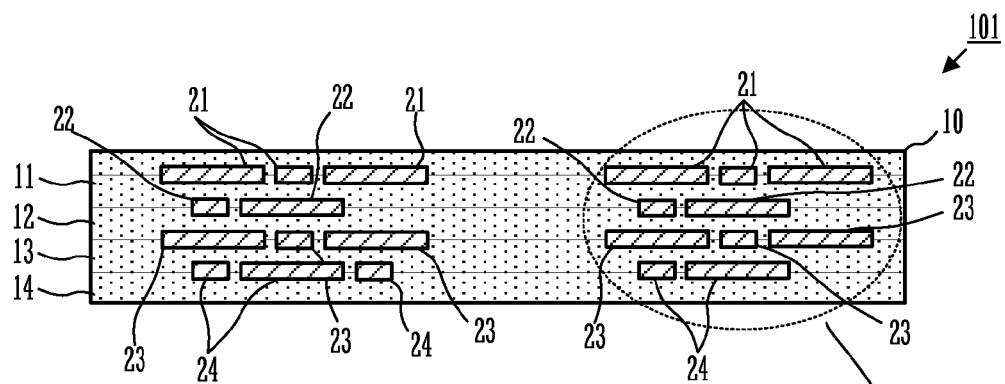
FIGS. 2A and 2B are cross-sectional views of the multilayer board.
Figure 2B:
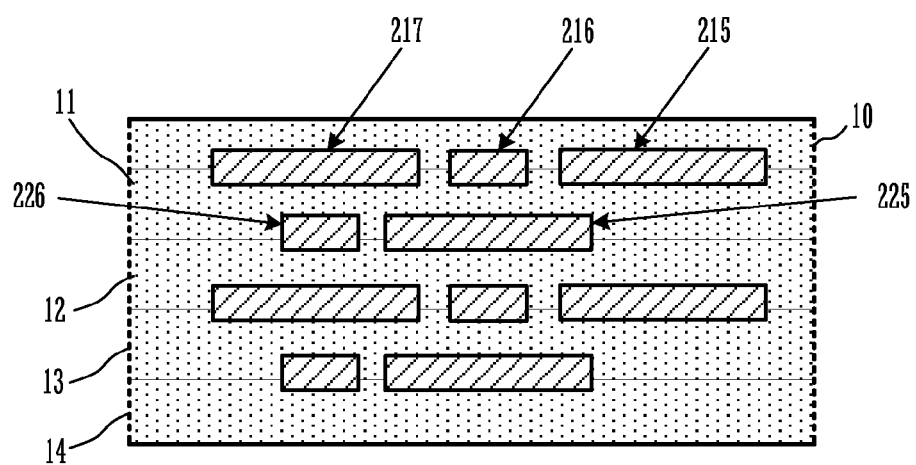

Hereinafter, multilayer boards according to preferred embodiments of the present invention will be described. FIG. 1 is exploded planar views of respective base material layers of a multilayer board 101, and FIG. 2A is a cross-sectional view of the multilayer board 101 at positions shown by alternate long and short dash lines in FIG. 1. FIG. 2B is an enlarged view of a portion of a region 100 shown by a dashed line in FIG. 2A.

The multilayer board 101 includes a base material layer 10, a base material layer 11, a base material layer 12, a base material layer 13, and a base material layer 14 which are stacked in this order from the upper surface side. The base material layer 10, the base material layer 11, the base material layer 12, the base material layer 13, and the base material layer 14 are preferably made of the same type of a thermoplastic resin, for example. The thermoplastic resin is, for example, a liquid crystal polymer resin. Examples of types of thermoplastic resins other than the liquid crystal polymer resin include PEEK (polyether ether ketone), PEI (polyether imide), PPS (polyphenylene sulfide), and PI (polyimide), and these resins may be used instead of the liquid crystal polymer resin.

A coil conductor 21, a coil conductor 22, a coil conductor 23, and a coil conductor 24 are provided on the upper surfaces of the base material layer 11, the base material layer 12, the base material layer 13, and the base material layer 14, respectively. Each of the coil conductor 21, the coil conductor 22, the coil conductor 23, and the coil conductor 24 is patterned in a spiral shape in a planar view, and includes a plurality of linear conductors (e.g., a linear conductor 215, a linear conductor 216, and a linear conductor 217 which will be described later).

Within the base material layer 11, a via conductor 61 is provided at a location where one end portion (an end portion at the center side) 21A of the coil conductor 21 is provided. The via conductor 61 interlayer-connects the one end portion 21A of the coil conductor 21 and one end portion (an end portion at the center side) 22A of the coil conductor 22. Within the base material layer 12, a via conductor 62 is provided at a location where another end portion (an end portion at the outer side) 22B of the coil conductor 22 is provided.

The via conductor 62 interlayer-connects the other end portion 22B of the coil conductor 22 and another end portion (an end portion at the outer side) 23B of the coil conductor 23. Within the base material layer 13, a via conductor 63 is provided at a location where one end portion 23A of the coil conductor 23 is provided. The via conductor 63 interlayer-connects the one end portion 23A of the coil conductor 23 and one end portion (an end portion at the center side) 24A of the coil conductor 24.

On the base material layer 10 defining the uppermost surface, a first terminal electrode 30A and a second terminal electrode 30B are provided. Within the base material layer 10, a via conductor 40B is provided at a location where the second terminal electrode 30B is provided. The via conductor 40B interlayer-connects the second terminal electrode 30B and another end portion (an end portion at the outer side) 21B of the coil conductor 21.

Within the base material layer 10, a via conductor 40A is provided at a location where the first terminal electrode 30A is provided. The via conductor 40A interlayer-connects the first terminal electrode 30A and an electrode 51 provided on the upper surface of the base material layer 11. Within the base material layer 11, a via conductor 41 is provided at a location where the electrode 51 is provided. The via conductor 41 interlayer-connects the electrode 51 and an electrode 52 provided on the upper surface of the base material layer 12. Within the base material layer 12, a via conductor 42 is provided at a location where the electrode 52 is provided. The via conductor 42 interlayer-connects the electrode 52 and an electrode 53 provided on the upper surface of the base material layer 13. Within the base material layer 13, a via conductor 43 is provided at a location where the electrode 53 is provided. The via conductor 43 interlayer-connects the electrode 53 and another end portion (an end portion at the outer side) 24B of the coil conductor 24.

In the multilayer board 101, a coil is provided by the coil conductor of each base material layer being connected by each via conductor. As shown in FIG. 6, a power supply portion is connected to the first terminal electrode 30A and the second terminal electrode 30B which are provided on the base material layer 10 which defines the uppermost surface, and when the power supply portion applies current to the coil, it is possible to cause the multilayer board 101 to define and function as an electromagnet.

Such a multilayer board 101 is manufactured preferably by initially forming the electrode and the coil conductor in each base material layer, stacking a plurality of the base material layers, and heating and pressing the base material layers, for example.

Figure 3A:
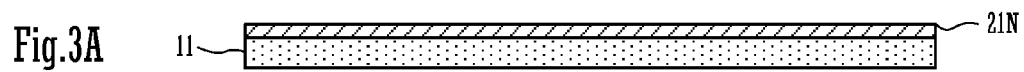
FIGS. 3A to 3D are diagrams showing a method of manufacturing the multilayer board.

FIGS. 3A to 3D are diagrams showing a non-limiting example of a method of manufacturing the multilayer board. The method of manufacturing the multilayer board includes a step of preparing a base material layer as shown in FIG. 3A. The base material layer is prepared by cutting a piece having a required area from a resin sheet having a metal (e.g., copper foil) previously attached to the entirety of one surface thereof. FIG. 3A shows an example where the base material layer 11 having copper foil 21N attached to the entirety of one surface thereof is prepared. The same applies to the other base material layers.

Figure 3B:
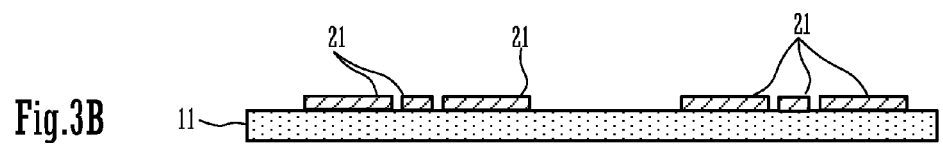

Next, as shown in FIG. 3B, the coil conductor 21 is provided by patterning the copper foil 21N (an example of a step of forming linear conductors). For example, photolithography or screen printing is used as a method of the patterning. The step of forming linear conductors is similarly performed for the other base material layers. It should be noted that although not shown, each electrode is also formed preferably in the step of forming linear conductors. In addition, although not shown, in the step of forming linear conductors (or in another step), a via hole is provided in the base material layer, and a conductive paste is filled into the via hole, such that each via conductor is also formed.

Figure 3C:
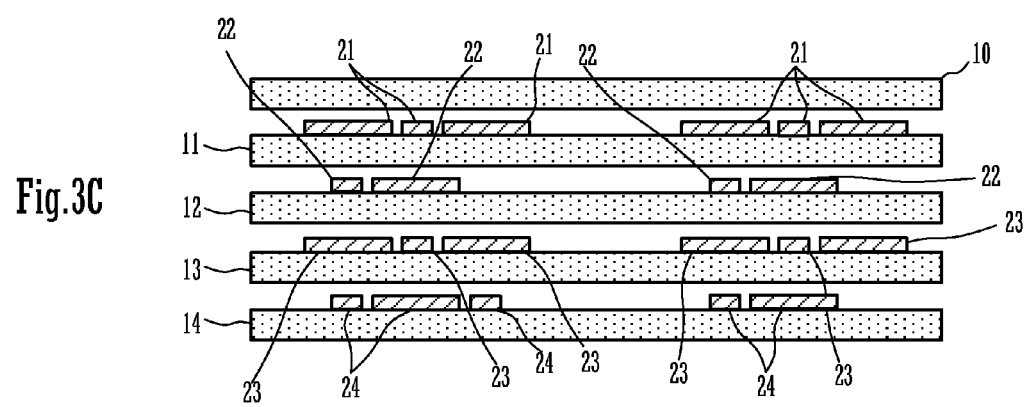
Figure 3D:
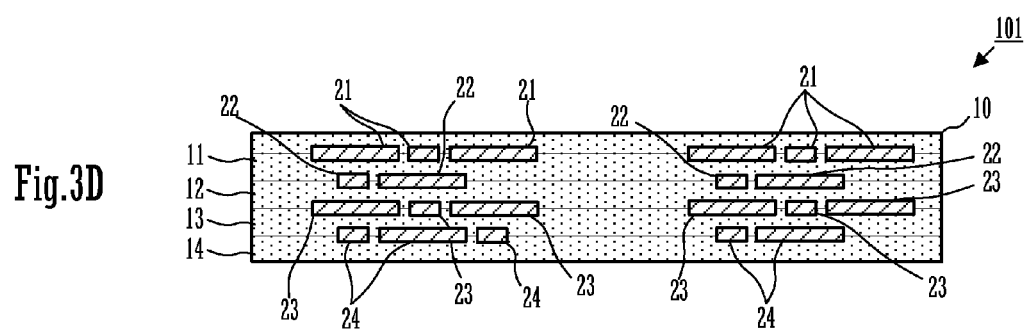

Next, as shown in FIG. 3C, each base material layer (the base material layer 10, the base material layer 11, the base material layer 12, the base material layer 13, and the base material layer 14) is stacked. At the end, as shown in FIG. 3D, the base material layers are heated and pressed with a heating press (an example of a step of heating and pressing). In this case, the thermoplastic resin flows so that gaps between the base material layers (gaps caused due to the thickness of the copper foil) are filled with the thermoplastic resin and the respective base material layers are fused to each other.

In the multilayer board 101 manufactured as described above, since the respective base material layers are firmly joined through hot pressing and the conductive paste filled in the via holes described above becomes solidified, the coil conductors and the via conductors are firmly joined at the interfaces thereof. In addition, the electrodes and the via conductors are firmly joined at the interfaces thereof.

Then, in the above-described step of forming linear conductors, a wide portion having a relatively large line width and a narrow portion having a relatively small line width are formed in a straight portion of each coil conductor that extends along a principal surface of each base material layer. Thus, the multilayer board 101 has the wide portion having a relatively large line width and the narrow portion having a relatively small line width, in the straight portion of each coil conductor. For example, as shown in FIG. 1, in the coil conductor 21, the right side portion in the drawing, of the outermost straight portion (referred to as linear conductor 215) of the coil, is a wide portion (wide-width portion) having a relatively large line width. The straight portion (referred to as linear conductor 216) inward of the outermost straight portion is a narrow portion (narrow-width portion) having a relatively small line width. In addition, the straight portion (referred to as linear conductor 217) farther inward of that straight portion is a wide-width portion.

In the coil conductor 22, the right-side portion in the drawing, of the outermost straight portion (referred to as linear conductor 225) of the coil, is a portion (wide-width portion) having a relatively large line width, and the straight portion (referred to as linear conductor 226) inward of that outermost straight portion is a narrow portion (narrow-width portion) having a relatively small line width.

Furthermore, the wide-width portion of the multilayer board 101 overlaps the entirety of the narrow-width portion on the base material layer adjacent thereto in the stacking direction, and end portions of the wide-width portions formed at both sides in the line width direction of the narrow-width portion, in a planar view. For example, as shown in the enlarged diagram of FIG. 2B, the linear conductor 225 which is a wide-width portion formed on the upper surface of the base material layer 12 overlaps the linear conductor 216, which is a narrow-width portion formed on the upper surface of the adjacent base material layer 11, in a planar view. Furthermore, the linear conductor 225 overlaps end portions of the linear conductor 215 and the linear conductor 217 which are formed at both sides of the linear conductor 216.

In the multilayer board 101, since the wide-width portion and the narrow-width portion are provided in the linear conductor of the same base material layer and the wide-width portion is disposed so as to overlap the end portion of the wide-width portion adjacent thereto in the stacking direction as described above, the resistance of the thermoplastic resin increases, and tilting in the stacking direction is significantly reduced or prevented. The narrow-width portion is located between the wide-width portions in the stacking direction, and tilting of the wide-width portions in the stacking direction is significantly reduced or prevented. Thus, tilting of the narrow-width portion in the stacking direction is also significantly reduced or prevented. In addition, in the multilayer board, since the narrow-width portion is present, it is not necessary to increase the center interval (pitch) between the narrow-width portion and the linear conductor adjacent thereto in the planar direction. Therefore, it is possible to significantly reduce or preventing tilting of the linear conductors in the stacking direction during thermocompression bonding without decreasing the wiring density, thus preventing the adjacent linear conductors from coming into contact with each other.

Figure 4A:
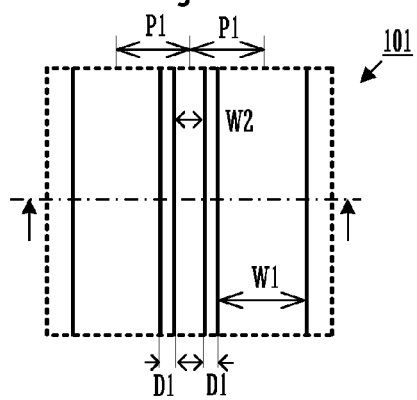
FIGS. 4A to 4F are diagrams showing a comparison between a multilayer board according to a preferred embodiment and an existing multilayer board.
Figure 4B:
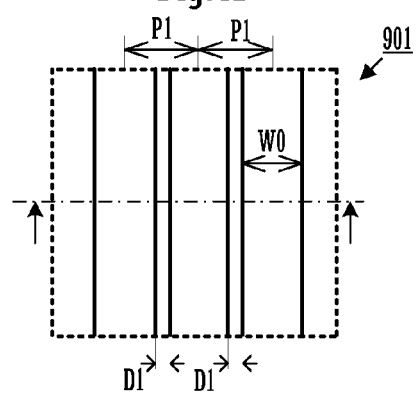
Figure 4C:
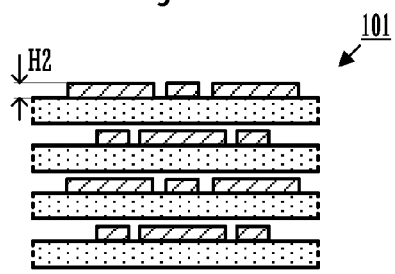
Figure 4D:
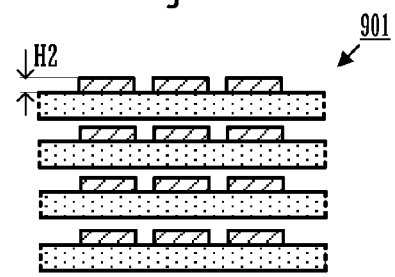
Figure 4E:
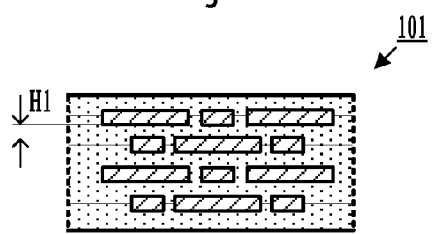
Figure 4F:
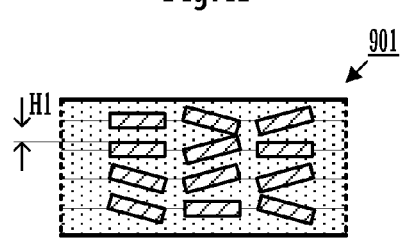

Hereinafter, advantages of the multilayer board 101 according to the present preferred embodiment will be described with reference to the drawings. First, FIGS. 4A to 4F are diagrams showing a comparison between the multilayer board 101 according to the present preferred embodiment and an existing multilayer board 901. FIG. 4A is a partial planar view showing some of the base material layers of the multilayer board 101 according to the present preferred embodiment, and FIG. 4B is a partial planar view showing some of the base material layers of the existing multilayer board 901 as a comparison target. FIG. 4C is a partial cross-sectional view showing each base material layer of the multilayer board 101 according to the present preferred embodiment before stacking (a cross-sectional view at a position shown by an alternate long and short dash line in FIG. 4A), and FIG. 4D is a partial cross-sectional view shown each base material layer of the existing multilayer board 901 before stacking as a comparison target (a cross-sectional view at a position shown by an alternate long and short dash line in FIG. 4B). FIG. 4E is a partial cross-sectional view of the multilayer board 101 according to the present preferred embodiment after hot pressing (a cross-sectional view at the position shown by the alternate long and short dash line in FIG. 4A), and FIG. 4F is a partial cross-sectional view of the existing multilayer board 901 after hot pressing as a comparison target (a cross-sectional view at the position shown by the alternate long and short dash line in FIG. 4B).

As shown in FIGS. 4B, 4D, and 4F, in the structure of the existing multilayer board 901, where line width W0 of linear conductor=100 μm, interlayer distance H1 after stacking=20 μm, and thickness H2 of linear conductor=20 μm, when each base material layer is stacked and hot pressing is performed, the linear conductors may tilt in the stacking direction due to flow of the thermoplastic resin, so that the adjacent linear conductors may come into contact with each other, causing a short circuit.

On the other hand, in the multilayer board 101 according to the present preferred embodiment, as shown in FIGS. 4A, 4C, and 4E, while interlayer distance H1=20 μm and thickness H2 of linear conductor=20 μm, for example, which are the same as in the existing multilayer board, line width W1 of wide-width portion=150 μm, and line width W2 of narrow-width portion=50 μm, for example. In this case, as shown in FIG. 4E, even when each base material layer is stacked and hot pressing is performed, the linear conductors do not greatly tilt in the stacking direction, and the adjacent linear conductors do not come into contact with each other.

Even when the wide-width portion is provided as described above, since the narrow-width portion is present, gaps D1 between the linear conductors adjacent to each other in the planar direction and pitches P1 at which the linear conductors are formed (center distances between the linear conductors adjacent to each other in the planar direction) are not changed as shown in FIGS. 4A and 4B. Therefore, as compared to the existing multilayer board 901, the multilayer board 101 according to the present preferred embodiment is able to significantly reduce or prevent tilting of the linear conductors in the stacking direction during thermocompression bonding without decreasing the wiring density, thus preventing the adjacent linear conductors from coming into contact with each other.

In the above example, the case has been described in which interlayer distance H1=20 μm and thickness H2 of linear conductor=20 μm. However, in addition, for the case where interlayer distance H1=18 μm and thickness H2 of linear conductor=12 μm, the case where interlayer distance H1=18 μm and thickness H2 of linear conductor=18 μm, the case where interlayer distance H1=25 μm and thickness H2 of linear conductor=18 μm, and the case where interlayer distance H1=13 μm and thickness H2 of linear conductor=18 μm, the present inventor has confirmed the effect that it is possible to significantly reduce or prevent tilting of the linear conductors in the stacking direction during thermocompression bonding, thus preventing the adjacent linear conductors from coming into contact with each other.

Because of the above, in the case where the interlayer distance H1 is about 0.5 times to about 1.5 times the thickness H2 of the linear conductor, for example, when a wide portion having a relatively large line width and a narrow portion having a relatively small line width are provided on the same base material layer, and in the base material layers adjacent to each other in the stacking direction, a location is provided at which the wide-width portion overlaps the narrow-width portion on the adjacent base material layer, and end portions of the wide-width portions at both sides of this narrow-width portion, in a planar view, it is possible to significantly reduce or prevent tilting of the linear conductors in the stacking direction during thermocompression bonding, thus preventing the adjacent linear conductors from coming into contact with each other.

In the existing multilayer board 901, where line width W0=100 μm and thickness H2 of linear conductor=20 μm, tilting of the linear conductors in the stacking direction increases. On the other hand, in the multilayer board 101 according to the present preferred embodiment, since a location is provided at which the line width is larger than 100 μm, for example, it is possible to significantly reduce or prevent tilting of the linear conductors in the stacking direction during thermocompression bonding, thus preventing the adjacent linear conductors from coming into contact with each other. Thus, when the line width of the linear conductor is larger than about 5 times that of the thickness of the linear conductor, for example, the effect of significantly reducing or preventing tilting in the stacking direction is great. Therefore, in the case where thickness H2 of linear conductor=12 μm, when the line width W1 of the wide-width portion is larger than 60 μm (W1>5·H2), for example, the effect of significantly reducing or preventing tilting in the stacking direction increases. In order to prevent wire breaking, the line width of the narrow-width portion is preferably at least about 10 μm to about 30 μm, for example.

Figure 5A:
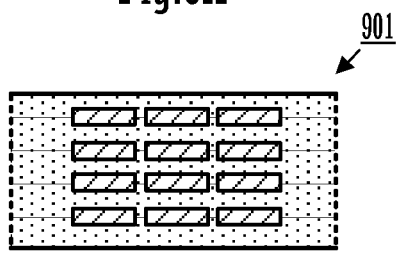
FIGS. 5A to 5D are diagrams each showing another form of the existing multilayer board.

FIGS. 5A to 5D are diagrams each showing another form of the existing multilayer board. As described above, in the structure of the existing multilayer board 901 as shown in FIG. 5A, when each base material layer is stacked and hot pressing is performed, the linear conductors tilt in the stacking direction due to flow of the thermoplastic resin, and the linear conductors adjacent to each other in the stacking direction may come into contact with each other, causing a short circuit.

Figure 5B:
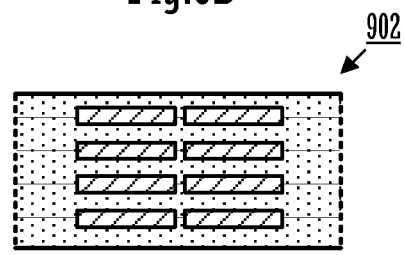

On the other hand, when the line width of each linear conductor is increased as shown in a multilayer board 902 in FIG. 5B, it is possible to significantly reduce or prevent tilting in the stacking direction. In addition, when wide-width portions are disposed in a staggered manner as shown in a multilayer board 903 in FIG. 5C, the resistance of the fluid thermoplastic resin is increased, so that it is possible to more reliably reduce or prevent tilting in the stacking direction. However, in order to increase the line width of each linear conductor, it is necessary to increase the center interval (pitch) between the linear conductors adjacent to each other in the planar direction, and when the line width is increased, the wiring density decreases. When the line width is relatively decreased as shown in a multilayer board 904 in FIG. 5D as compared to the case shown in FIG. 5C, it is possible to increase the wiring density, but a possibility that the linear conductors tilt in the stacking direction increases due to the decreased line width.

Figure 5C:
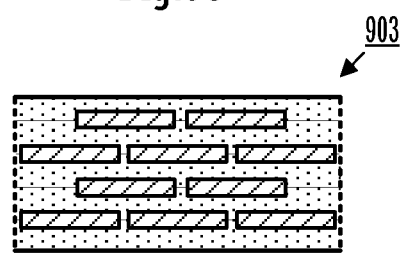
Figure 5D:
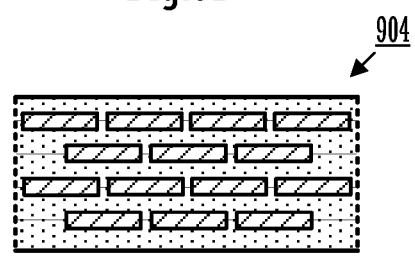

On the other hand, in the multilayer board 101 according to the present preferred embodiment, since the wide-width portions are disposed such that the end portions thereof overlap each other similarly to the multilayer board 903 in FIG. 5C, the resistance of the fluid thermoplastic resin increases, so that it is possible to reliably reduce or prevent tilting in the stacking direction. In addition, since the narrow-width portions are present, it is unnecessary to increase the center interval (pitch) between the linear conductors adjacent to each other in the planar direction, and the wiring density does not decrease as compared to the multilayer board 901 in FIG. 5A. Furthermore, the narrow-width portion is located between the wide-width portions in the stacking direction, and tilting of the wide-width portions in the stacking direction is significantly reduced or prevented. Thus, tilting of the narrow-width portion in the stacking direction is also significantly reduced or prevented. Therefore, the multilayer board 101 is able to reliably reduce or prevent tilting of the linear conductors in the stacking direction during thermocompression bonding without decreasing the wiring density, thus preventing the adjacent linear conductors from coming into contact with each other.

Even when the number of the base material layers is two, for example, the multilayer board has the effect of significantly reducing or preventing tilting in the stacking direction, but the number of the base material layers is preferably three or more, for example. When the number of the base material layers is three or more, for example, the narrow-width portion is located between the wide-width portions in the up-down direction, so that it is possible to further reduce or prevent tilting in the stacking direction. In addition, the wide-width portions overlap each other at the end portions thereof in the up-down direction (are disposed in a staggered manner), so that it is possible to more reliably reduce or prevent tilting in the stacking direction.

In the coil provided in the multilayer board according to the present preferred embodiment, the linear conductors of the respective base material layers are densely disposed in a spiral shape. Thus, it is important to significantly reduce or prevent tilting of the linear conductors in the stacking direction during thermocompression bonding without decreasing the wiring density. In particular, since the line width of each linear conductor varies in the multilayer board according to the present preferred embodiment, it is preferable if the multilayer board is used as an electronic component for a circuit (having a frequency of 100 MHz or lower, for example) other than a high-frequency circuit, and, for example, it is preferable if the multilayer board is used as an electromagnet further including a power supply portion which applies current to the coil in the multilayer board, for example. Such an electromagnet is applicable to a voice coil motor. However, it is possible to use the multilayer board according to the present preferred embodiment as an electronic component for a high-frequency circuit, for example, by smoothly changing the line width near the boundary between the wide-width portion and the narrow-width portion.

Since the straight portion of the coil is more likely to tilt particularly in the stacking direction than the non-straight portion (e.g., a corner portion), a wide portion and a narrow portion are preferably provided in the straight portion of the coil.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer board comprising:
    a plurality of stacked base material layers each made of a thermoplastic resin and including a plurality of linear conductors provided thereon; wherein
    on a same one of the plurality of base material layers, the linear conductors include a first wide portion having a relatively large line width and a first narrow portion having a relatively small line width; and
    the first wide portion overlaps a second narrow portion having a relatively small line width provided on an adjacent base material layer that is adjacent to the same one of the plurality of base material layers and the first wide portion overlaps end portions of second wide portions having relatively large line widths that are provided on the adjacent base material layer and disposed at both sides of the second narrow portion in a line width direction, in a planar view.

2. The multilayer board according to claim 1, wherein the linear conductors of each of the base material layers are interlayer-connected to define a coil.

3. The multilayer board according to claim 1, wherein a number of the stacked base material layers is three or more.

4. The multilayer board according to claim 2, wherein the coil has a spiral shape.

5. The multilayer board according to claim 4, wherein
    the coil includes a straight portion extending along a principal surface of the base material layer; and
    the first wide portion, the first narrow portion, the second narrow portion, and the second wide portions are located in the straight portion of the coil.

6. The multilayer board according to claim 1, wherein
    at least one of the second wide portions disposed at both sides of the second narrow portion on the adjacent base material layers in the line width direction overlaps the first narrow portion which is adjacent to the first wide portion on the same one of the plurality of base material layers in the line width direction, in a planar view.

7. The multilayer board according to claim 1, further comprising via conductors that interlayer-connect the linear conductors.

8. The multilayer board according to claim 1, wherein an interlayer distance between adjacent base material layers is about 0.5 to 1.5 times a thickness of the linear conductors.

9. The multilayer board according to claim 1, wherein a line width of the first narrow portion and the second narrow portion is about 10 μm to about 30 μm.

10. An electromagnet comprising:
    the multilayer board according to claim 1; and
    a power supply portion that applies current to the coil of the multilayer board.

* * * * *